US012635555B2

(12) United States Patent
Yuan et al.

(10) Patent No.: US 12,635,555 B2
(45) Date of Patent: May 19, 2026

(54) FULL AG SINTER DISCRETE PREMIUM PACKAGE

(71) Applicant: SEMICONDUCTOR COMPONENTS INDUSTRIES, LLC, Scottsdale, AZ (US)

(72) Inventors: XiaoYing Yuan, Suzhou (CN); Jie Chang, Suzhou (CN); Keunhyuk Lee, Suzhou (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 482 days.

(21) Appl. No.: 18/185,514

(22) Filed: Mar. 17, 2023

(65) Prior Publication Data

US 2024/0312855 A1 Sep. 19, 2024

(51) Int. Cl.
| | |
|---|---|
| *H01L 23/31* | (2006.01) |
| *H01L 21/56* | (2006.01) |
| *H01L 23/00* | (2006.01) |
| *H01L 23/495* | (2006.01) |

(52) U.S. Cl.
CPC ........ *H01L 23/3107* (2013.01); *H01L 21/565* (2013.01); *H01L 23/49513* (2013.01); *H01L 23/4952* (2013.01); *H01L 23/49551* (2013.01); *H01L 23/49562* (2013.01); *H01L 24/32* (2013.01); *H01L 24/48* (2013.01); *H01L 24/73* (2013.01); *H01L 2224/32245* (2013.01); *H01L 2224/48247* (2013.01); *H01L 2224/73265* (2013.01); *H01L 2924/13091* (2013.01)

(58) Field of Classification Search
CPC ..................... H01L 23/3107; H01L 23/49524

USPC ......................................................... 257/666
See application file for complete search history.

(56) References Cited

U.S. PATENT DOCUMENTS

| | | | |
|---|---|---|---|
| 5,859,471 A * | 1/1999 | Kuraishi | ........... H01L 23/49548 |
| | | | 257/E23.092 |
| 6,249,041 B1 * | 6/2001 | Kasem | .................... H01L 24/33 |
| | | | 257/E23.044 |
| 7,872,337 B2 * | 1/2011 | Tsunoda | ............ H01L 23/49861 |
| | | | 257/666 |
| 11,069,600 B2 | 7/2021 | Tean et al. | |
| 2004/0070059 A1 | 4/2004 | Hori et al. | |

(Continued)

FOREIGN PATENT DOCUMENTS

EP 3761359 A1 1/2021

OTHER PUBLICATIONS

International Search Report for counterpart application No. PCT/US2024/018504, mailed Jul. 3, 2024, 16 pages.

*Primary Examiner* — Quoc D Hoang
(74) *Attorney, Agent, or Firm* — Brake Hughes Bellermann LLP

(57) ABSTRACT

A package includes a semiconductor die attached to a substrate and a mold body encapsulating the semiconductor die. A first portion of a lead is directly bonded to a contact pad on the semiconductor die with no intervening component between the first portion of the lead and the contact pad. A second portion of the lead extends outside the mold body to form an external terminal of the package. The lead is a dual gauge lead with the first portion of the lead having a thickness perpendicular to the contact pad that is smaller than a thickness of the second portion of the lead extending outside the mold body.

24 Claims, 10 Drawing Sheets

(56)        References Cited

U.S. PATENT DOCUMENTS

| 2004/0262720 | A1* | 12/2004 | Satou .................... H10D 30/63 |
| | | | 257/676 |
| 2019/0103342 | A1* | 4/2019 | Neugirg ................. H01L 24/49 |
| 2020/0273790 | A1 | 8/2020 | Tay et al. |
| 2020/0303281 | A1 | 9/2020 | Jeun et al. |
| 2023/0081341 | A1 | 3/2023 | Kawashiro |

* cited by examiner

300

400

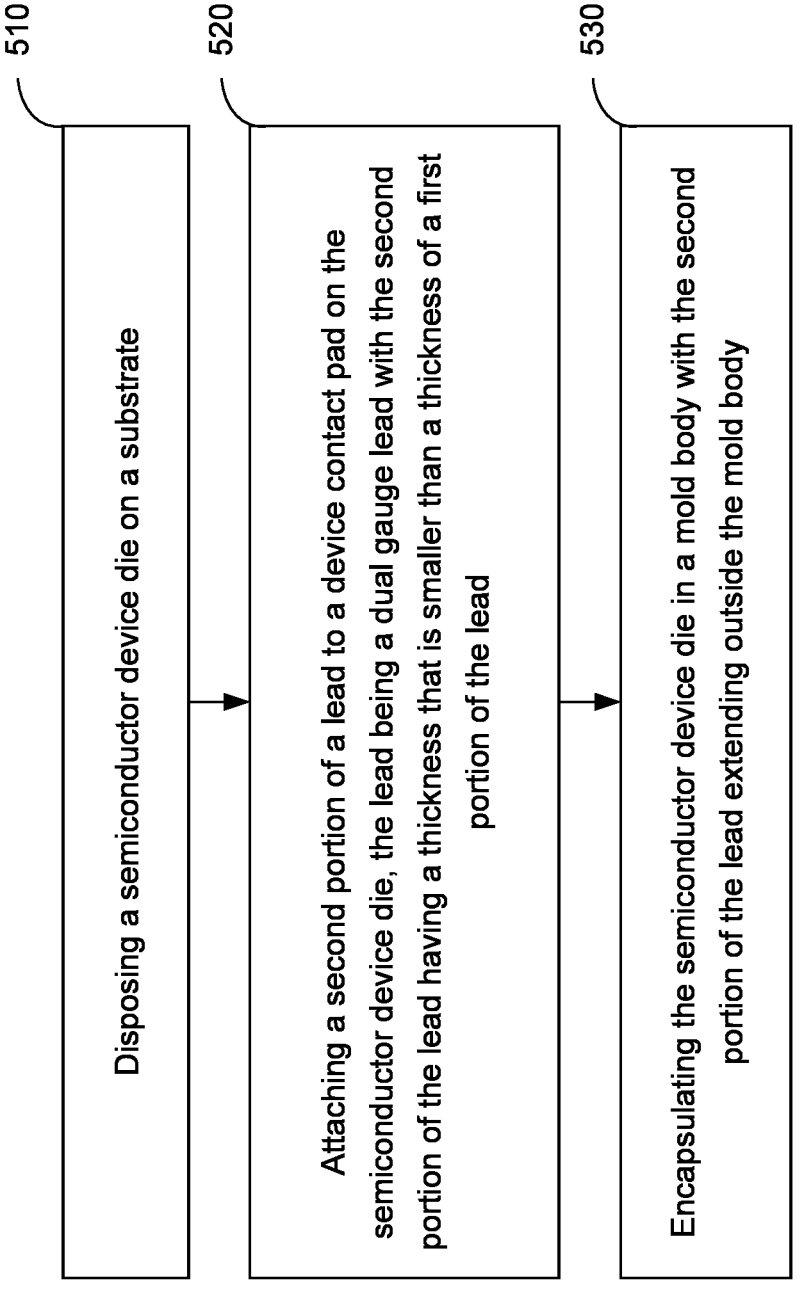

510 Disposing a semiconductor device die on a substrate

520 Attaching a second portion of a lead to a device contact pad on the semiconductor device die, the lead being a dual gauge lead with the second portion of the lead having a thickness that is smaller than a thickness of a first portion of the lead 530 Encapsulating the semiconductor device die in a mold body with the second portion of the lead extending outside the mold body

FULL AG SINTER DISCRETE PREMIUM PACKAGE

TECHNICAL FIELD

This description relates to packaging of semiconductor die and integrated circuits.

BACKGROUND

A semiconductor package includes a metal, plastic, glass, or ceramic casing containing one or more semiconductor devices or integrated circuits. Individual components are fabricated on semiconductor wafers (commonly silicon, or silicon carbide wafers) before being diced into die, tested, and packaged. The package provides a means for connecting the semiconductor devices or integrated circuits to the external environment, such as printed circuit board, via leads such as lands, balls, or pins; and protection against threats such as mechanical impact, chemical contamination, and light exposure. With increasing demand for high-performance ICs, new improvements are needed in packaging technologies to bring out the ICs' performance and reliability.

SUMMARY

In a general aspect, a package includes a semiconductor die attached to a substrate and a mold body encapsulating the semiconductor die. A first portion of a lead is directly bonded to a contact pad on the semiconductor die with no intervening component between the first portion of the lead and the contact pad. A second portion of the lead extends outside the mold body to form an external terminal of the package.

In a further aspect, the lead is a dual gauge lead with the first portion of the lead having a thickness perpendicular to the contact pad that is smaller than a thickness of the second portion of the lead extending outside the mold body.

In a general aspect, a package includes a semiconductor die attached to a substrate and a mold body encapsulating the semiconductor die. A first portion of a first lead is directly attached to a source contact pad on the semiconductor die and a second portion of the first lead extends outside the mold body to form an external source terminal of the package. The first portion of the first lead is directly attached to the source contact pad with no intervening component between the first portion of the first lead and the source contact pad. Further, a first portion of a second lead is directly attached to a gate contact pad on the semiconductor die with a second portion of the second lead extending outside the mold body to form an external gate terminal of the package. The first portion of the second lead is directly attached to the gate contact pad with no intervening component between the first portion of the first lead and the source contact pad.

In a general aspect, a method includes disposing a semiconductor device die on a substrate, and attaching a second portion of a lead directly to a device contact pad on the semiconductor device die without an intervening component between the lead and the device contact pad. The lead is a dual gauge lead with the second portion of the lead having a thickness that is smaller than a thickness of a first portion of the lead. The method further includes encapsulating the semiconductor device die in a mold body with the first portion of the lead extending outside the mold body.

The details of one or more implementations are set forth in the accompanying drawings and the description below. Other features will be apparent from the description and drawings, and from the claims.

BRIEF DESCRIPTION OF THE DRAWINGS

FIG. 5 illustrates an example method for fabricating a semiconductor device package.

DETAILED DESCRIPTION

Figure 1:
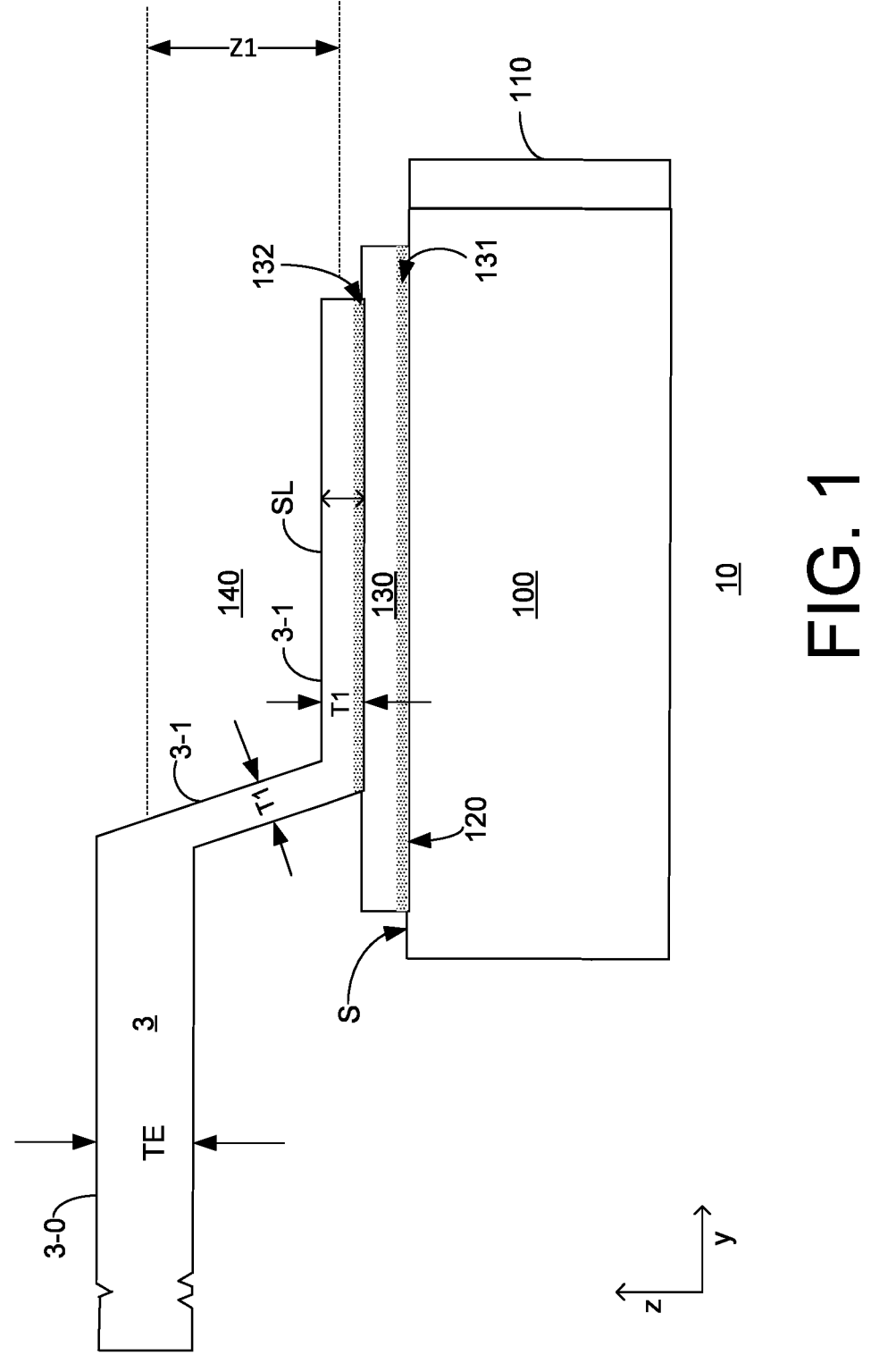
FIG. 1 illustrates, in a cross-sectional view, a semiconductor device package.

A semiconductor device package includes a semiconductor die mounted on a lead frame structure that includes leads providing external electrical connections (external to the package) for individual devices or integrated circuits in the semiconductor die. The semiconductor die can be mounted on a paddle or flag in the leadframe structure using a solder or a conductive adhesive. Further, device contact pads on the semiconductor die are electrically connected using wire bonds (e.g., aluminum wire bonds) to respective ones of the leads. The leads, which extend to an outside of the package body, form external terminal pins that can be used to mount the package on a printed circuit board or terminal strip. In example implementations, the terminal pins can be installed in sockets or soldered to a printed circuit board (PCB) or terminal strip.

There can be many package types used in various applications. Some are defined by international, national, or industry standards, while others are particular to an individual manufacturer. The number and configuration of external terminal pins of a package type may be defined by international, national, or industry standards.

For a device or IC package, a coefficient of thermal expansion (CTE) mismatch between the semiconductor die and the lead frame (e.g., a copper lead frame) or CTE mismatch between a clip (e.g., a copper clip) and the semiconductor die can introduce high stress on the solder between the components. Cracks can be observed after temperature cycling. Further, wire fatigue (of an aluminum wire connecting a gate of the semiconductor die and the lead frame) can be a weakness in a typical package during power cycles.

The packaging implementations described herein address these issues and provide a cost effective and reliable solution for packaging a semiconductor die (e.g., a power transistor, a silicon carbide (SiC) MOSFET, or another device).

In accordance with the principles of the present disclosure, in example packaging implementations, a sinter (e.g., silver (Ag) sinter, a silver-based sinter) may be used to mutually couple, bond, or attach two different components of a semiconductor die package.

In a sintering process, a sinter species (e.g., Ag atoms) may diffuse into, and hold, the two different components together. Sintering improves reliability of the attachment (bonding) of the two components together by avoiding use of an intermediate joining layer (e.g., a solder or adhesive) that can crack, for example, on temperature cycling. In example implementations, for example, an Ag-based sinter can be used to attach a semiconductor die to a die attach pad (DAP) in a lead frame structure.

Further, in accordance with the principles of the present disclosure, a direct lead attach (DLA) process can be used to attach leads forming the external terminals of the package directly (e.g., in direct contact without a wire connection or other intervening element) to the device contact pads (e.g., source, gate, sense, and drain contact pads) on the semiconductor die.

A first portion of a lead forms an external terminal of the package and a second portion of the lead is attached to a device contact pad (e.g., source, gate, sense, and drain contact pads) on the semiconductor die. In example implementations, the lead can be a dual gauge lead with the first portion of the lead having a first thickness and the second portion of the lead having a second thickness. The second thickness can be the same as, or smaller than the first thickness.

The first thickness may determine the strength and rigidity of the external terminals used for coupling the package to a socket or a PCB (e.g., in a customer application). However, use of large external terminal dimensions for leads inside the package (that are attached to device contact pads on the semiconductor die) can degrade the structural integrity of the package (e.g., during thermal cycling). Large leads inside the package can cause proportionally large expansion and contraction stresses that may cause cracking, for example, at the lead-device contact pad interface or in the mold body during power cycling of the package. Use of leads inside the package with a smaller thickness (e.g., a second thickness smaller than the first thickness) may reduce the expansion and contraction stresses that may be generated at the lead-device contact pad interface in the package or in the mold body, for example, during power cycling of the package.

Use of a dual gauge lead allows the problem of external terminal strength and reliability to be addressed independently from the problem of the internal structural integrity and reliability of the package during power cycling.

FIG. 1 shows a cross-sectional view of a package 10 that includes components that are coupled together by sintering (e.g., Ag sintering, etc.) and utilizes a dual gauge lead, in accordance with the principles of the present disclosure.

In package 10 (e.g., a discrete semiconductor device package) a semiconductor die 130 (e.g., a 1200V SiC MOSFET, maximum current ~600 A, power ~500 KW) is encapsulated in a mold body (e.g., mold body 140) made of an epoxy or a molding compound. Semiconductor die 130 may be disposed on a die attach pad (e.g., DAP 120) on a surface S of a substrate 100 in the package. Semiconductor die 130 may be attached to DAP 120 by a sinter (e.g., a silver-based sinter, (e.g., Ag sinter 131)). A lead (e.g., lead 3) may be attached to a device contact pad (e.g., a source contact pad, not shown) on the semiconductor die 130. In example implementations, the source contact pad may have a width greater than 1.0 mm and a current carrying capacity greater than 200 amperes.

Lead 3 may include a lead portion (e.g., lead portion 3-0) forming an external terminal of the package, and a lead portion (e.g., source lead extension 3-1) that terminates in source contact lead area SL that is attached to the device contact pad on semiconductor die 130. Source contact lead area SL may be attached to the device contact pad on semiconductor die 130 by a sinter (e.g., Ag sinter (e.g., Ag sinter 132)).

In example implementations, lead portion 3-0 forming the external terminal of the package may extend in a y direction and lie generally in an x-y plane. Source contact lead area SL may generally lie in another x-y plane (parallel to the device contact pad on semiconductor die 130) that is offset from the x-y plane of lead portion 3-0 by a distance Z1. In lead 3.0, source lead extension 3-1 may be bent to transition continuously over the distance Z1 from the x-y plane of lead portion 3-0 to the x-y plane of source contact lead area SL.

Lead 3 may be a dual gauge lead with lead portion 3-0 having a thickness TE and lead portion (e.g., source lead extension 3-1) having a different thickness TI (in the z direction). Thickness TE may correspond to the thickness requirements for coupling the external terminal formed by lead portion 3-0 to a printed circuit board according to an industry standard for device packages. For example, for an industry standard D2PAK, thickness TE may be about 0.5 mm. In example implementations, thickness TI of source lead extension 3-1 (including source contact lead area SL) may be the same as, or less than TE (in consideration of reducing the mechanical stress at the interface between the source contact lead area SL and the semiconductor die while power cycling). In example implementations, thickness TI may be in a range of about 0.1 mm to about 0.4 mm (e.g., 0.125 mm) while TE is about 0.5 mm. More generally, in example implementations, a ratio of thickness TE to thickness T1 may be in range of 0.2 to 1.0 (i.e., 20% to 100%).

In example implementations, substrate 100 may be coupled to a header portion (e.g., header 110) above (e.g., in the y direction) the substrate. Header 110 may be electrically connected to DAP 120 through the substrate and may be a drain or ground terminal for the semiconductor die in the package.

In the fabrication of a discrete semiconductor device package according to the principles of the present disclosure, a lead frame structure may include a lead preform or clip (hereinafter direct lead attach clip or "DLA clip") that includes the leads that can be directly attached to the device contact pads. The leads may include dual gauge leads. The DLA clip can include a collar (e.g., a copper (Cu) collar) that holds the individual leads that are directly attached to respective contact pads (e.g., source, gate, sense, and drain contact pads, etc.) on the semiconductor die and form the respective external terminal leads of the package. An Ag sinter can be used to attach the directly attached leads to the respective contact pads on the semiconductor die. The directly attached leads may replace some or all of aluminum wire bonds that could be otherwise used to connect the contact pads (e.g., source, gate, and sense, and drain contact pads) on the semiconductor die to respective external terminal leads of the package.

The foregoing principles (e.g., using an Ag sinter to attach a semiconductor die to a DAP, using a direct lead attach (DLA) process to form the external terminals coupled to device contact pads) of the present disclosure may be used in the fabrication of any type of package. However, for purposes of illustration these principles are further discussed herein with reference to FIG. 1 through FIG. 6G in the context of a semiconductor device package (e.g., a discrete semiconductor device package, FIG. 6G) that may be configured, for example, as a three terminal D2PAK-3L or a seven terminal D2PAK-7L type of package.

Figure 2:
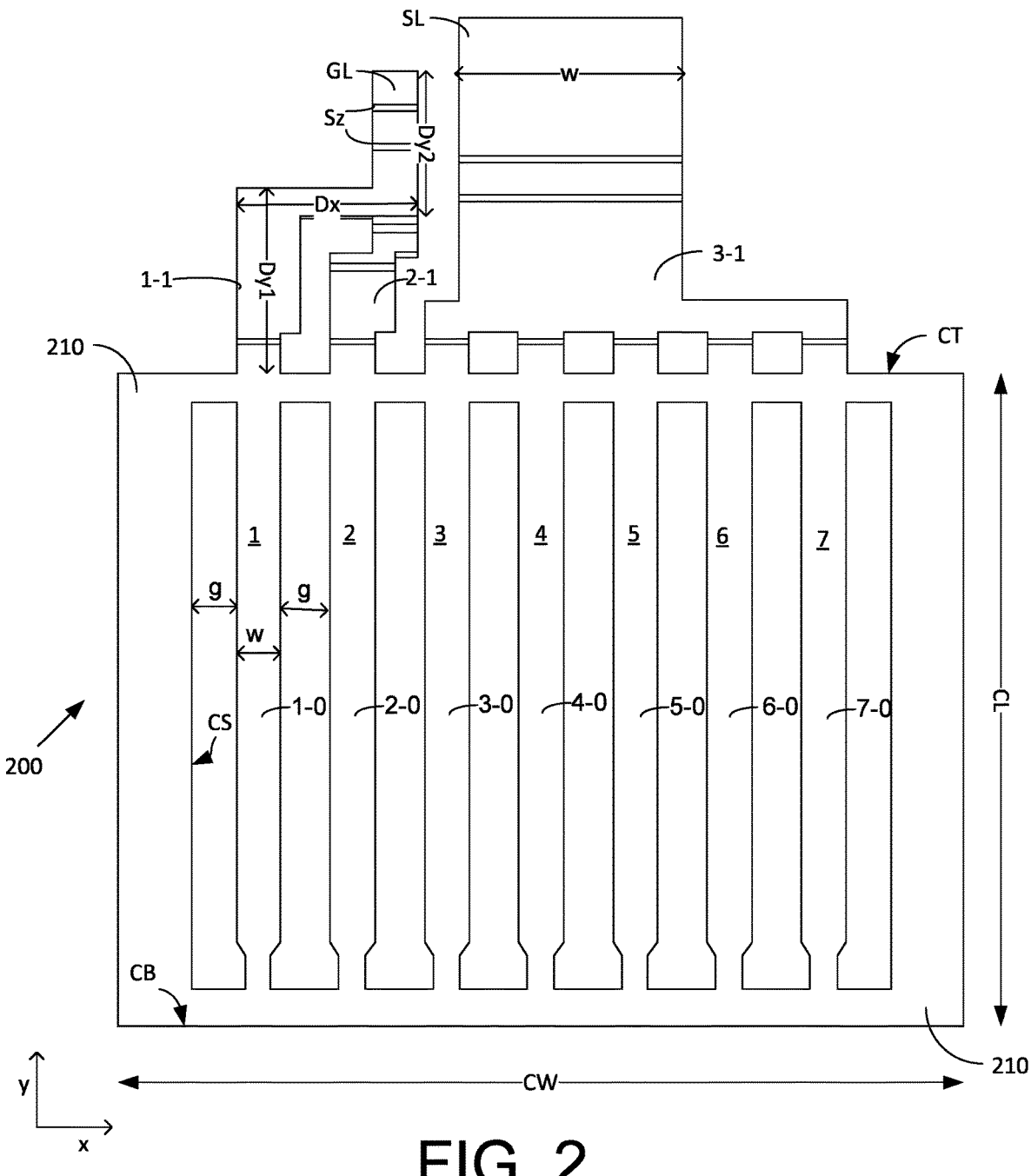
FIG. 2 illustrates, in a top plan view, an example direct lead attach (DLA) clip that includes pre-formed leads that can be directly attached to the device contact pads of a semiconductor die in a package.

The lead frame structure of a device package may include a DAP substrate (e.g., substrate 100) and pre-formed leads contained in a direct lead attach (DLA) clip (e.g., DLA clip 200, FIG. 2).

FIG. 2 shows an example direct lead attach clip (e.g., DLA clip 200) that includes pre-formed leads that can be directly attached to the device contact pads of a semiconductor die in a package and form the external terminals of the package.

DLA clip 200 may include a plurality of strips of metal or leads (e.g., lead 1, lead 2, lead 3, lead 4, lead 5, lead 6 and lead 7). An annular ring or collar 210 having, for example, a width CW (in a x direction) and a height CH (in a y direction) may hold portions (e.g., lead portion 1-0, lead portion 2-0, lead portion 3-0, lead portion 4-0, lead portion 5-0, lead portion 6-0 and lead portion 7-0, etc.) of the plurality of strips of metal (e.g., leads 1-7). These lead portions may extend (in the y direction) from a top CT of collar 210 to a bottom CB of collar 210, and may generally lie in the plane (e.g., x-y plane) of collar 210. These lead portions may be precursors of the external terminals (e.g., gate, sense and source terminals) of the package in which DLA clip 200 is used. In example implementations, the lead portions (e.g., lead portion 1-0) may have a width w (e.g., in the x direction) and a thickness TE (FIG. 1) in the z direction.

In example implementations, a lead portion (e.g., lead portion 1-0, lead portion 2-0, lead portion 3-0, lead portion 4-0, lead portion 5-0, lead portion 6-0 and lead portion 7-0, etc.) may be separated from a neighboring lead portion by a gap (e.g., distance g) in the x direction. FIG. 2 shows, for example, lead portion 1.0 (extending in the y direction) separated neighboring lead portion 2.0 by a gap (e.g., distance g) in the x-direction. Lead portion 1.0 (extending in the y direction) is also separated from a side CS of collar 210 by a gap (e.g., distance g) in the x-direction.

The leads (e.g., lead 1, lead 2, lead 3, lead 4, lead 5, lead 6 and lead 7, etc.) in DLA clip 200 may further include lead portions or extensions (e.g., gate lead extension 1-1, sense lead extension 2-1, and source lead extension 3-1) that extend above top CT of collar 210. These extensions, which extend in three-dimensional space (e.g., x, y and z) from above top CT of collar 210, may end or terminate in areas (e.g., gate contact lead area GL, sense contact lead area (sense contact lead area SSL, FIG. 3B), and source contact lead area SL) that can be coupled (e.g., by Ag sinter or other conductive material) to device contact pads (e.g., source, gate and sense contact pads) on a semiconductor die. In example implementations, the source contact lead area SL may have a width W (e.g., in the x direction) and a thickness (e.g. thickness TI, in the z direction, FIG. 1).

In example implementations, the lead portions or extensions (e.g., gate lead extension 1-1, sense lead extension 2-1, and source lead extension 3-1) that extend above top CT of collar 210 may at least initially extend for a distance in the same (e.g., y direction) as the corresponding lead portions (e.g., lead portion 1-0, lead portion 2-0, lead portion 3-0) below top CT of collar 210. In some implementations, the lead portions or extensions (e.g., lead portion 1-1, lead portion 2-1) may then change direction and zig-zag in the x and z directions) so that contact lead areas (e.g., gate contact lead area GL, sense contact lead area SSL, source contact lead area SL, FIG. 3B) at the ends of the lead portions or extensions (e.g., lead portion 1-1, lead portion 2-1, lead portion 3-1) are aligned to be attached to device contact pads present on the surface of a semiconductor die (e.g., source contact pad SP, sense contact pad SSP, and gate contact pad GP on semiconductor die 130, FIG. 6D). As shown in FIG. 2, for example, gate lead extension 1-1 may extend in the y direction for a distance Dy1 above collar 210, then zigzag to the right in the x direction for a distance Dx and then in the y direction for a distance Dy2 to an end of the gate contact lead area GL. Steps of gate lead extension 1-1 in the z direction are not visible in the two dimensions of FIG. 2 but are indicated by the close pairs of double lines Sz marked across the width of gate lead extension 1-1 in FIG. 2.

In example implementations, some of the leads may share common lead portions or extensions. For example, as shown in FIG. 2, several leads (e.g., lead 3, lead 4, lead 5, lead 6, and lead 7) are connected to, and share, a common lead extension (i.e., source lead extension 3-1).

DLA clip 200 may be made fabricated from a sheet of metal (e.g., copper) by cutting, stamping, or other material shaping and removal processes.

Figure 3A:
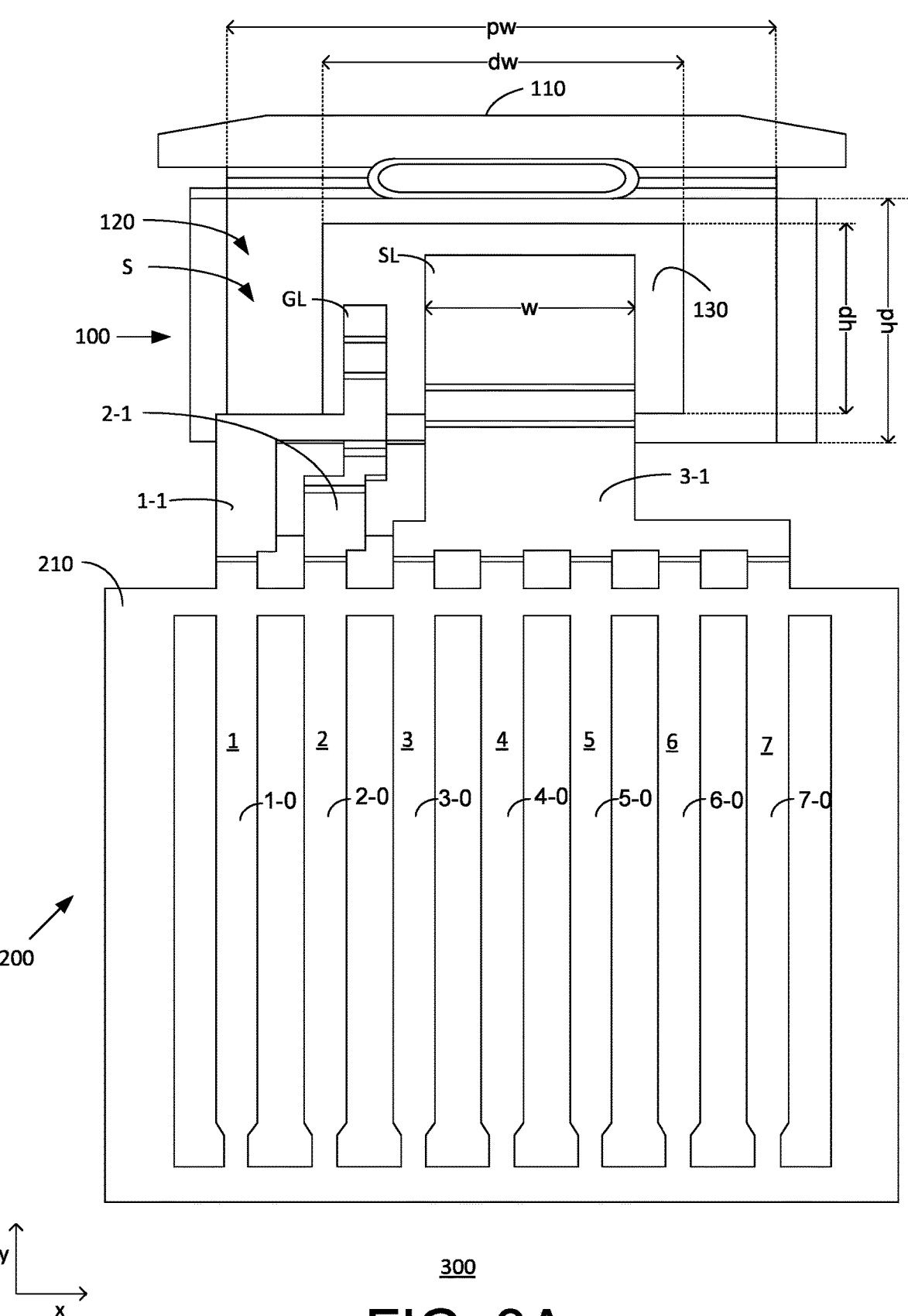
FIG. 3A through 3C illustrate various views of a package assembly including a DLA clip coupled to a substrate.
Figure 3B:
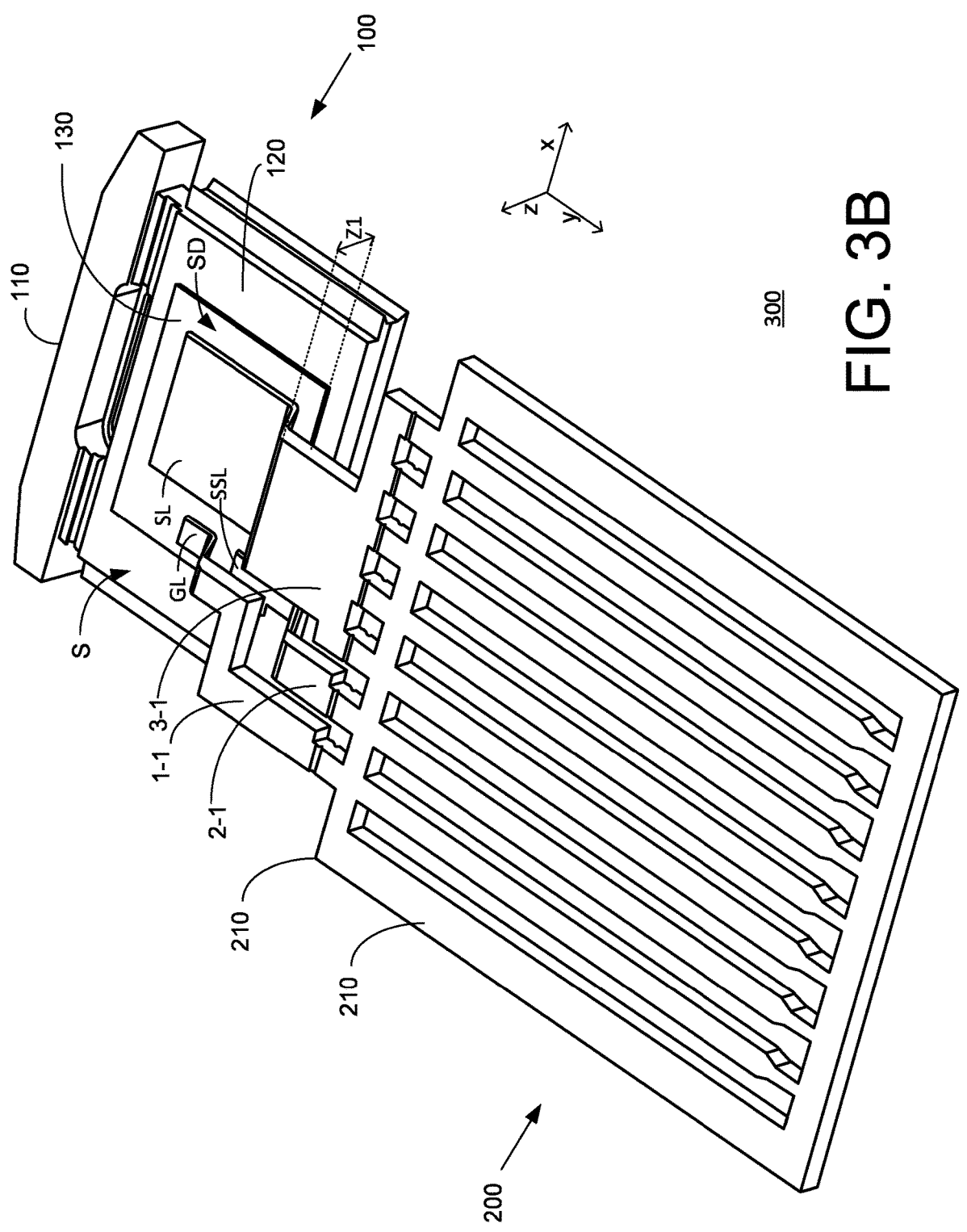
Figure 3C:
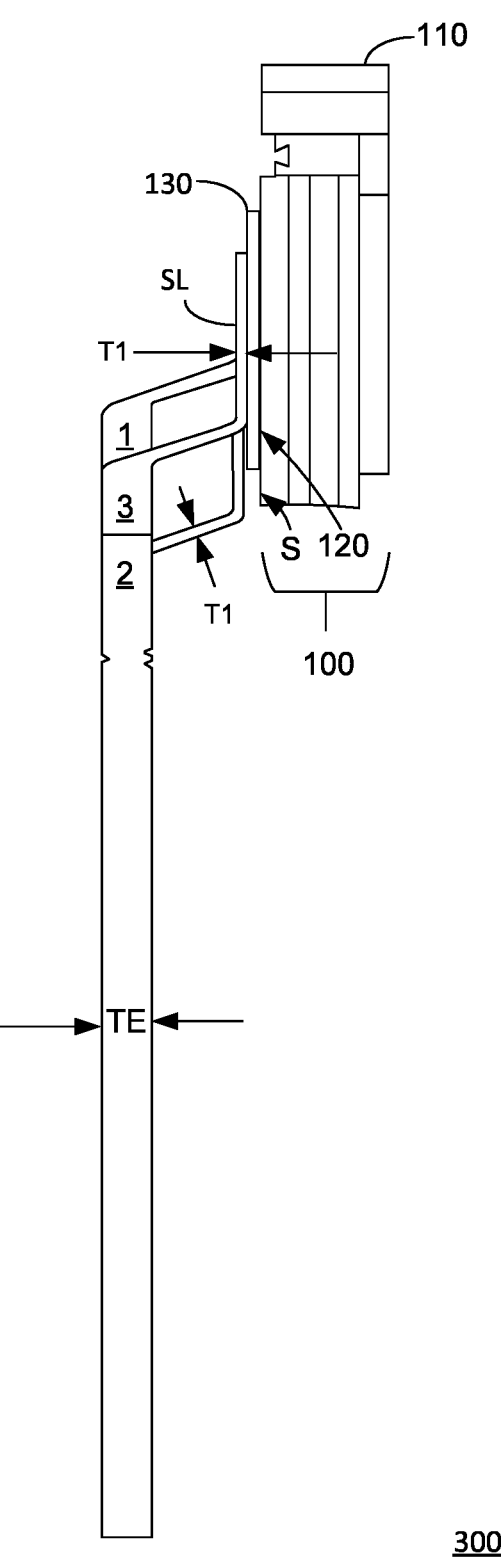

FIG. 3A through FIG. 3C show various views of a package assembly 300 including a DLA clip 200 coupled to substrate 100. FIG. 3A shows top plan view, FIG. 3B shows a side perspective view, and FIG. 3C schematically shows a cross-sectional side view of package assembly 300.

As shown in FIG. 3A through FIG. 3C, substrate 100, which may be made of a substrate made of metal (e.g., copper), includes a die attach pad (e.g., DAP 120) formed on a top surface S of the substrate. DAP 120 may, for example, have a rectangular area with a height ph (in the y direction) and a width pw (in the x direction). Substrate 100 may include a header portion (e.g., header 110) above (e.g., in the y direction) DAP 120. Header portion (e.g., header 110) may be electrically connected through the substrate to DAP 120.

A semiconductor die (e.g., semiconductor die 130) may be disposed on and attached to DAP 120. Semiconductor die 130 (e.g., a SiC MOSFET device) may be attached to DAP 120, for example, by a layer of Ag sinter (not visible in FIG. 3A through FIG. 3C). A top surface SD of semiconductor die 130 may include device contact pads (e.g., device contact pads (e.g., source, sense, and gate contact pads, FIG. 6D) that are not visible in FIG. 3A through FIG. 3C.

Further, lead portions (e.g., gate lead extension 1-1, sense lead extension 2-2, and source lead extension 3-1) that extend above top CT of collar 210 of DLA clip 200 may be coupled to device contact pads (e.g., source, sense and gate contact pads) of semiconductor die 130. In example implementations, the end areas (e.g., gate contact lead area GL, sense contact lead area (not shown), source contact lead area SL) of gate lead extension 1-1, sense lead extension 2-1, and source lead extension 3-1) may be coupled (e.g., by Ag sinter or other conductive material) to the respective device contact pads on semiconductor die 130.

In example implementations, width W of the source contact lead area SL in DLA clip 200 may be varied (during fabrication of DLA clip 200), for example, in proportion to the size of a target die (e.g., die 130). In example implementations, for a die width dw of about 5.2 mm, width W of the source contact lead area SL may be equal to about 3.0 mm; for a die width dw of about 4.7 mm, width W may be equal to about 2.5 mm; and for a die width dw of about 4.2 mm, width W may be equal to about 2.0 mm.

In some implementations, some of the lead portions (e.g., lead portion 1-0, lead portion 2-0, lead portion 3-0, lead portion 4-0, lead portion 5-0, lead portion 6-0 and lead portion 7-0, etc.) in DLA clip 200 may be redundant or duplicative. For example, lead portion 1-0 and lead portion 2-0 may be used to form the external terminals of the package for the gate and sense contact pads on the semiconductor die. Lead portion 3-0 may be used to form the external terminal for the source contact pad on the semiconductor die. Lead portions 4-0 through 7-0 (being connected to lead portion 3-1) may be duplicative or redundant at least in the sense that any of them could be used instead of lead portion 3-0 to form the external terminal for the source contact pad on the semiconductor die, for example, in a three terminal D2PAK-3L type package.

After DLA clip 200 is coupled to substrate 100 by Ag sintering of the leads to the respective device contact pads on semiconductor die 130, collar 210 may be removed (e.g., cut) from DLA clip 200. Further, redundant or duplicate leads or lead portions that are not needed to form the external terminals of the device package may be removed from DLA clip 200. For example, for the three terminal D2PAK-3L type of package, lead portion 1-0, lead portion 2-0, and lead portion 3-0 may be used as the external terminals for gate, sense and source of the device. Lead portions 4-0 through 7-0 that are duplicative of lead portion 3-0 may be removed from the assembly along with removal of collar 210.

FIG. 3C schematically shows a side view of the package assembly after removal of collar 210 and the duplicative lead portions 4-0 through 7-0.

In example implementations, for automated (or partially automated) assembly line construction of packages (e.g., device package), an array of substrates (e.g., substrate 100) together with an array of DLA clips (e.g., DLA clip 200) may be supplied (e.g., to an assembly line tool)) on a reeled substrates frame. The array of substrates and the array of DLA clips can be held in the reeled substrates frame between a pair of spaced-apart runner strips with indexing holes. The reeled substrates frame including the array of substrates may be fabricated by plating copper traces and pads (on a PCB sheet).

Figure 4:
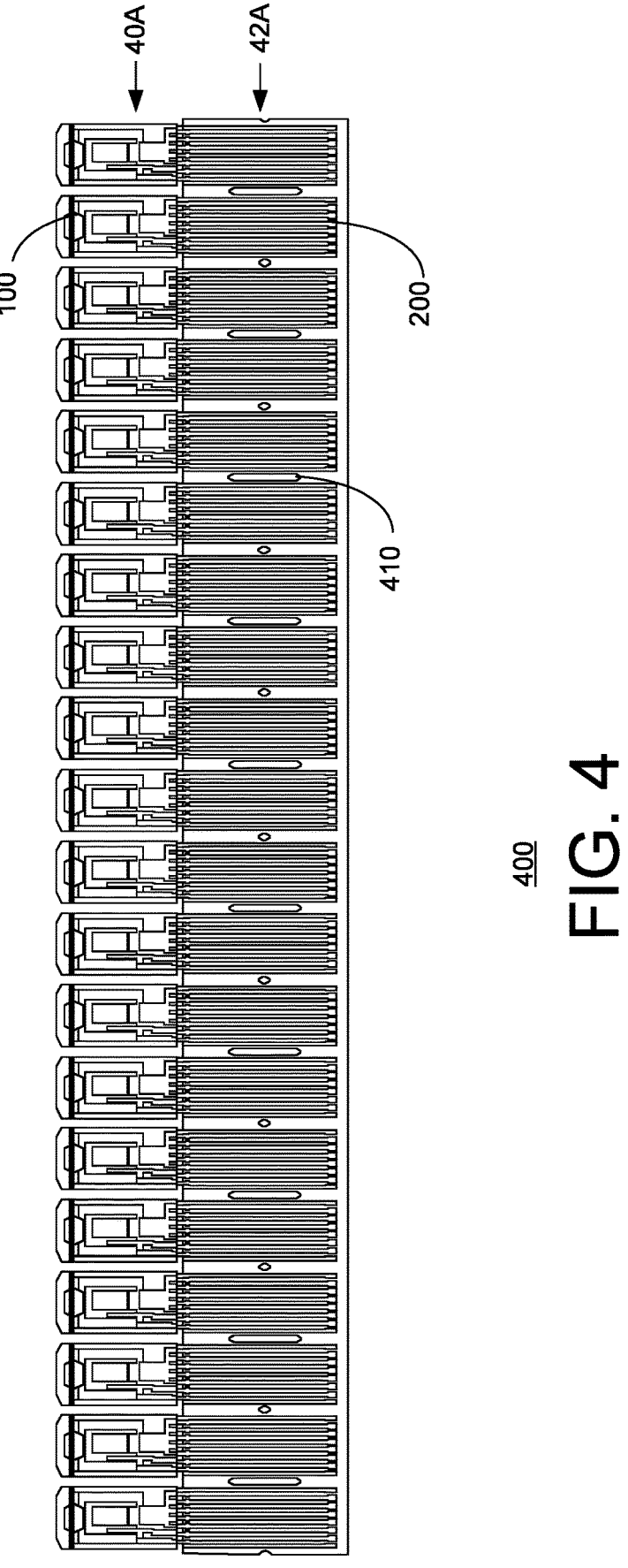
FIG. 4 illustrates an example reeled substrates frame including an array of substrates and an array of DLA clips.

FIG. 4 shows an example reeled substrates frame 400 including an array (e.g., array 40A) of substrates 100 together with an array (e.g., array 42A) of DLA clips 200.

Substrates frame 400 may include a spaced-apart holed runner strip. The runner strip may include indexing holes 410 to assist in positioning and aligning reeled substrates frame 400 in, for example, assembly line processing tools (e.g., a singulation tool, a die pick-and-place tool, material injection tools, etc.).

FIG. 5 illustrates an example method 500 for fabricating a discreet semiconductor device package.

Method 500 may include disposing a semiconductor device die on a substrate (510), and attaching a second portion of a lead to a device contact pad on the semiconductor device die (520). The lead can be a dual gauge lead with the second portion of the lead having a thickness that is smaller than a thickness of a first portion of the lead.

Method 500 may further include encapsulating the semiconductor device die in a mold body with the first portion of the lead extending outside the mold body (530). The first portion of the lead extending outside the mold body can be shaped as an external terminal of the discrete semiconductor device package.

In example implementations of method 500, disposing the semiconductor device die on the substrate 510, may include bonding the semiconductor device die to a die attach pad (DAP) on the substrate using an adhesive material (e.g., solder, solder bumps, solder paste, or adhesive paste) to bond the die to the DAP. In example implementations, bonding the semiconductor device die to a die attach pad (DAP) on the substrate may include using a silver-based sinter to bond the die to the DAP.

Further, attaching the second portion of the lead to the device contact pad on the semiconductor device die may include bonding the second portion of the lead to the device contact pad. In example implementations, bonding the second portion of the lead to the device contact pad may include using an adhesive material (e.g., solder, solder bumps, solder paste, or adhesive paste) to bond the second portion of the lead to the device contact pad. In example implementations, attaching the second portion of the lead to the device contact pad may include using a silver-based sinter to bond the second portion of the lead to the device contact pad.

In example implementations, the device contact pad is a source contact pad of the semiconductor device die. The source contact pad may have a width greater than 1.0 mm and a current carrying capacity greater than 200 amperes.

In example implementations of method 500, the lead may be a first lead, and disposing the semiconductor device die on the substrate 510 may include attaching a direct lead attach (DLA) clip to the semiconductor die. The DLA clip may include a plurality of leads including the first lead attached to an annular collar. Each of the plurality of leads can be a dual gauge lead with the second portion of the lead having a thickness that is smaller than a thickness of a first portion of the lead. First portions of the plurality of leads including the first portion of the first lead may extend between a top and a bottom of the annular collar. Second portions of the plurality of leads including the second portion of the first lead may extend above the top of the annular collar.

In example implementations, the plurality of leads attached to the annular collar may include up to seven leads in number (as shown in FIG. 2). In example implementations, some of the leads may share common second lead portions or extensions. For example, as shown in FIG. 2, several leads (e.g., lead 3, lead 4, lead 5, lead 6, and lead 7) are connected to, and share, a common second lead portion (i.e., source lead extension 3-1).

In example implementations, attaching the second portion of the lead to the device contact pad on the semiconductor device die may include: attaching the second portion of the first lead of the plurality of leads to the first device contact pad, attaching a second portion of a second lead of the plurality of leads to a second device contact pad, and attaching a second portion of a third lead of the plurality of leads to a third device contact pad on the semiconductor die. Attaching the second portions of the first, second and third leads to the respective device contact pads may involve Ag-based sintering.

Method 500 may involve encapsulating the semiconductor device die in a mold body 530 after attaching the second portions of the first, second and third leads to the respective device contact pads. Method 500 may further involve removing (e.g., cutting) the annular collar to individually separate the first portions of leads attached to the annular collar. Method 500 may further include shaping the first portions of the leads extending outside the mold body as external terminals of the discrete semiconductor device package.

FIGS. 6A-6G show views of a device package (e.g., discrete semiconductor device package 600, FIG. 6G) at different stages of construction on a substrate (e.g., substrate 100), or after the different steps of method 500 for fabricating a discreet semiconductor device package.

Figure 6B:
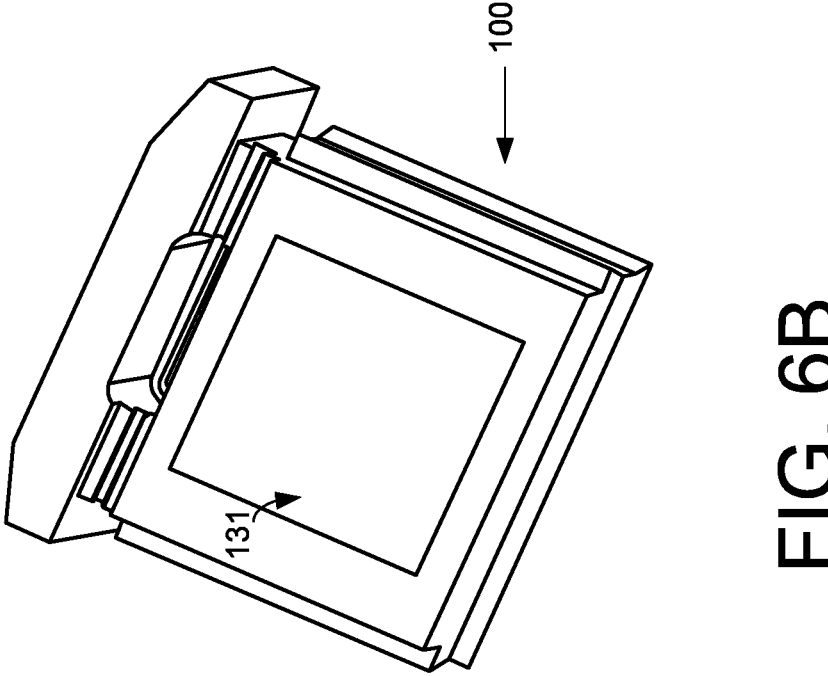
FIGS. 6A through 6G illustrate cross-sectional views of device package at different stages of construction.
Figure 6A:
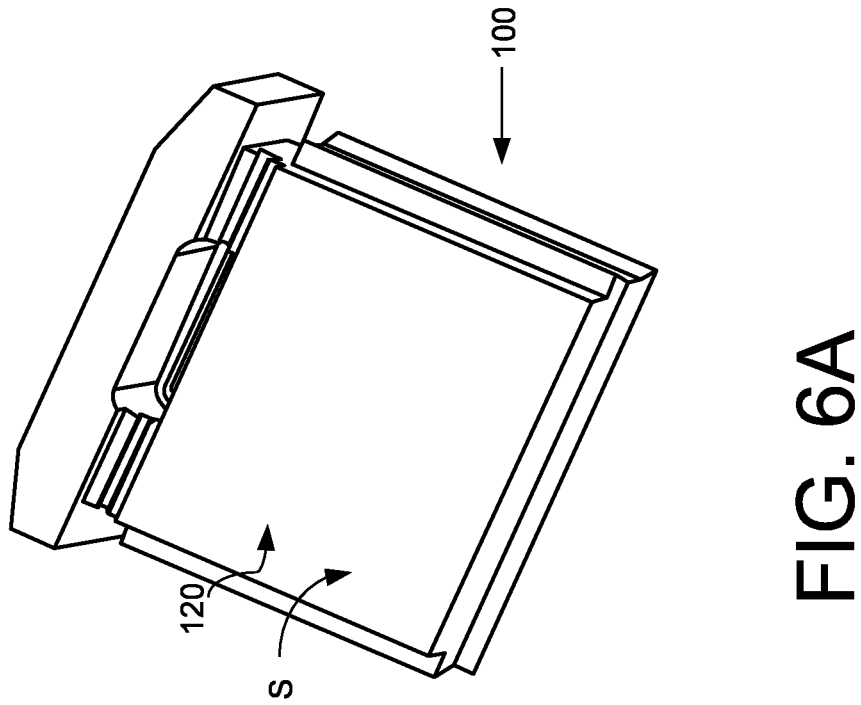

FIG. 6A shows a substrate 100 of the discrete semiconductor device package at a first stage of construction. Substrate 100 includes a die attach pad (e.g., DAP 120) formed on a top surface S of the substrate. In example implementations, DAP 120 may be Cu pad, an Al pad, or a metal layer of a direct bonded metal (DBM) substrate.

FIG. 6B shows a substrate 100 of the discrete semiconductor device package at a second stage of construction. At this stage, an Ag sinter material layer (Ag sinter 131) is disposed on DAP 120. The Ag sinter material may, for example, be nanoscale Ag particle paste.

Figure 6D:
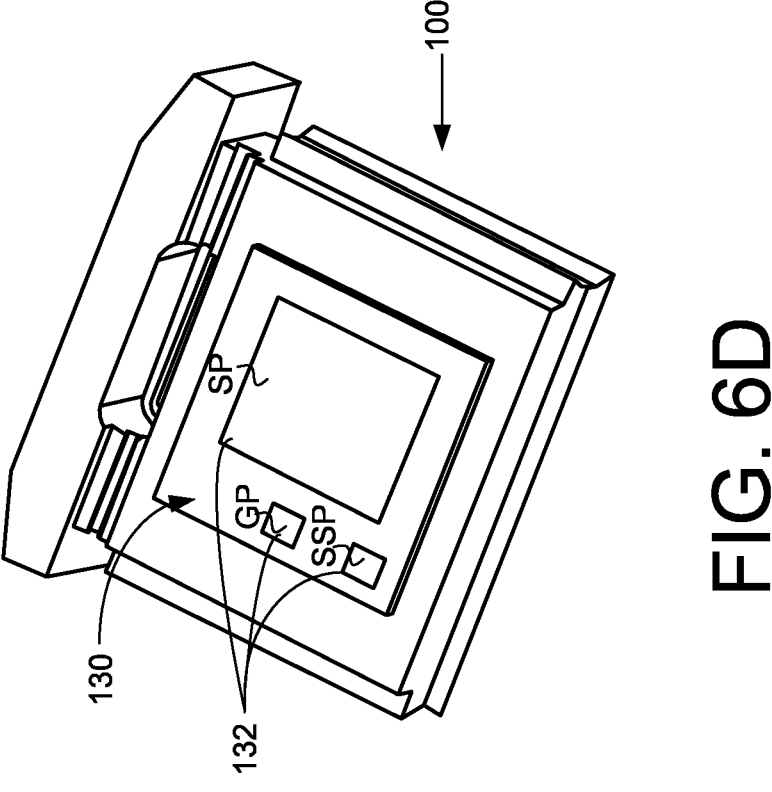
Figure 6C:
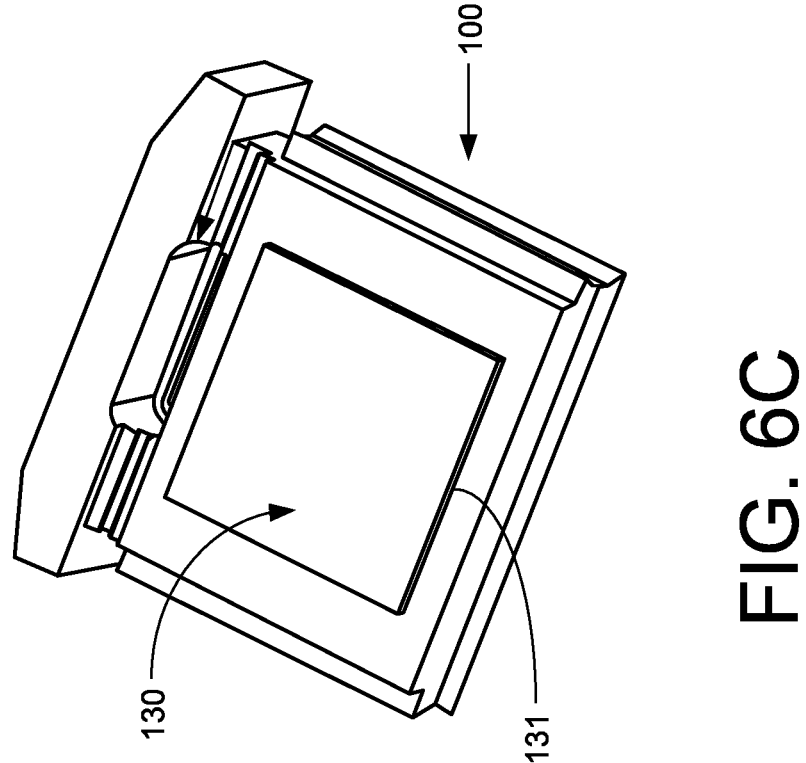

FIG. 6C shows substrate 100 of the discrete semiconductor device package at a third stage of construction. At this stage, a semiconductor device die (e.g., semiconductor die 130) is disposed on AG sinter 131 and subject to low temperature sintering treatment. The low temperature sintering of AG sinter 131 may bond semiconductor die to 130 to the DAP 120. In example implementations, the low temperature sintering may involve sintering temperatures, for example, in a range of about 200° C. to about 300° C. (e.g., 250° C.). The sintering process can result in the sintering material (e.g., Ag species) diffusing completely into semiconductor die 130 and DAP 120 so that semiconductor die 130 is directly bonded to DAP 120 with no distinct residual sintering material layer or intervening component left between semiconductor die 130 and DAP 120 (in other words, the semiconductor die 130 directly contacts or is directly bonded to DAP 120).

FIG. 6D shows substrate 100 of the discrete semiconductor device package at a fourth stage of construction. At this stage, an Ag sinter material layer (Ag sinter 132) is disposed on device contact pads (e.g., source contact pad SP, sense contact pad SSP, and gate contact pad GP) present on the surface of semiconductor die 130. The Ag sinter material (e.g., Ag sinter 132) may be composed, like Ag sinter 131, of nanoscale Ag particle paste.

Figures 6E, 6F, 6G:
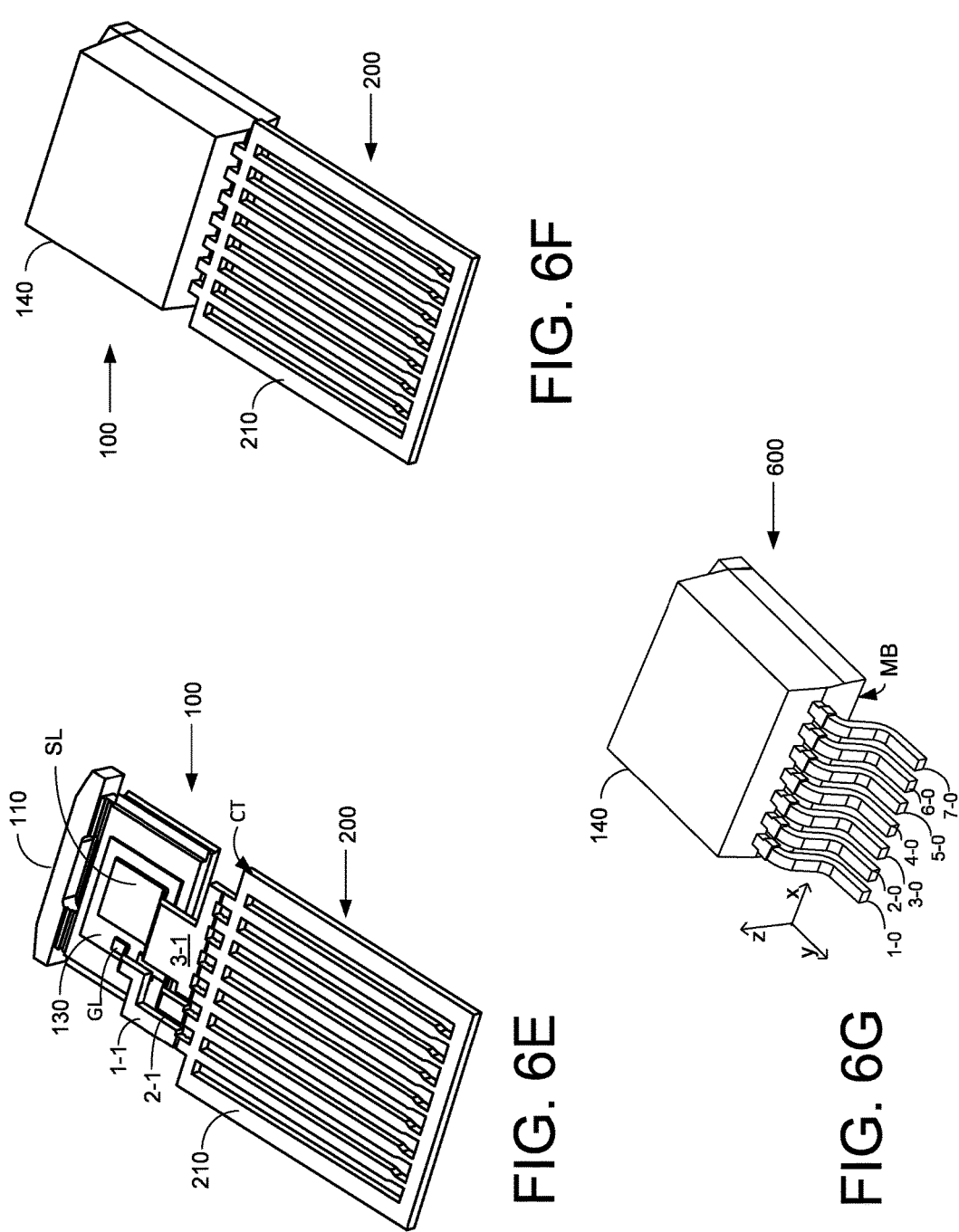

FIG. 6E shows substrate 100 of the discrete semiconductor device package at a fifth stage of construction. At this stage, a DLA clip (e.g., DLA clip 200) is coupled to substrate 100. DLA clip 200 (as shown in FIG. 2) holds dual gauge leads (e.g., lead 1, lead 2, lead 3, lead 4, lead 5, lead 6 and lead 7, etc.) in a collar (e.g., collar 210) with lead portions or extensions (e.g., gate lead extension 1-1, sense lead extension 2-1, and source lead extension 3-1) extending above top CT of collar 210. These extensions, which extend in three-dimensional space (e.g., x, y and z) from above top CT of collar 210 terminate in lead contact areas (e.g., gate contact lead area GL, sense contact lead area (not shown), source contact lead area SL) that are directly coupled, for example, by Ag sinter 132 to device contact pads (e.g., source contact pad SP, sense contact pad SSP, and gate contact pad GP, FIG. 6D) present on the surface of semiconductor die 130. The sintering process can result in the sintering material diffusing completely into the lead contact areas and device contact pads so that the lead contact areas (e.g., gate contact lead area GL, sense contact lead area SSL, and source contact lead area SL) are directly bonded to the device contact pads (e.g., source contact pad SP, sense contact pad SSP, and gate contact pad GP, FIG. 6D) with no distinct residual sintering material layer or intervening component left between the lead contact areas and the device contact pads (in other words, the leads directly contact or are directly bonded to the device contact pads).

At a sixth stage of construction, as shown in FIG. 6F, semiconductor die 130 that is Ag sintered to the substrate and portions of the leads extending from DLA clip 200 may be encapsulated in mold body 140 made of a molding compound. Portions of DLA clip 200 including collar 210 that holds lead portions (e.g., lead portion 1-0, lead portion 2-0, lead portion 3-0, lead portion 4-0, lead portion 5-0, lead portion 6-0 and lead portion 7-0, etc.) remain outside mold body 140.

At a seventh stage of construction, collar 210 is removed (e.g., by singulation). Further, lead portions that are not needed to form external terminals may also be removed. In the example shown in FIG. 6G all seven lead portions (lead portion 1-0, lead portion 2-0, lead portion 3-0, lead portion 4-0, lead portion 5-0, lead portion 6-0 and lead portion 7-0) are kept. Further, these lead portions may be bent (e.g., stamped) to a desired shape to form the external terminals of the package. In example implementations, the package (e.g., semiconductor device package 600) may be of a type intended for surface mounting on a circuit board with the external terminals shaped to lie flat on a circuit board (e.g., PCB) surface. In the example shown in FIG. 6G, the lead portions are bent so that their end portions lie flat in the x-y plane along the bottom of mold body 140.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A package comprising:
a semiconductor die attached to a substrate;
a mold body encapsulating the semiconductor die;
a first portion of a lead directly bonded to a contact pad
on the semiconductor die, the first portion being in a
first plane and having a first thickness perpendicular to
the contact pad;
a second portion of the lead extending outside the mold
body to form an external terminal of the package, the
second portion being in a second plane and having a
second thickness, the second thickness being greater
than the first thickness; and
a transition portion between the first portion and the
second portion, the transition portion having a third
thickness smaller than the second thickness.

2. The package of claim 1, wherein the first portion of the
lead as a thickness that less than 0.5 mm.

3. The package of claim 1, wherein the contact pad is a
source pad contact pad of the semiconductor die, the source
pad contact pad having a width greater than 1.0 mm and a
current carrying capacity greater than 200 amperes.

4. The package of claim 1, wherein the semiconductor die
attached to the substrate by a sintering process.

5. The package of claim 1, wherein the first portion of the
lead is directly attached to the contact pad by a sintering
process.

6. The package of claim 1, wherein the semiconductor die
is a silicon carbide (SiC) power transistor.

7. The package of claim 1, wherein the third thickness and
the first thickness are a same thickness.

8. A package comprising:
a semiconductor die attached to a substrate;
a mold body encapsulating the semiconductor die;
a first portion of a first lead directly attached to a source
contact pad on the semiconductor die, the first portion
being in a first plane and having a first thickness
perpendicular to the source contact pad;
a second portion of the first lead extending outside the
mold body to form an external source terminal of the
package, the second portion being in a second plane
and having a second thickness, the second thickness
being greater than the first thickness;
a transition portion of the first lead, the transition portion
connecting the first portion and the second portion, the
transition portion having a third thickness smaller than
the second thickness; and
a first portion of a second lead directly attached to a gate
contact pad on the semiconductor die, a second portion
of the second lead extending outside the mold body to
form an external gate terminal of the package, the first
portion of the second lead being directly attached to the
gate contact pad with no intervening component
between the first portion of the first lead and the source
contact pad.

9. The package of claim 8, wherein the first portion of the
first lead is directly attached to the source contact pad by a
sintering process.

10. The package of claim 8, wherein the first portion of the
first lead as a thickness that is less than 0.5 mm.

11. The package of claim 8, wherein the source contact
pad has a width greater than 1.0 mm and a current carrying
capacity greater than 200 amperes.

12. The package of claim 8, wherein the semiconductor
die is attached to the substrate by a sintering process.

13. The package of claim 8, wherein the semiconductor
die is a silicon carbide (SiC) power transistor.

14. The package of claim 8, wherein the third thickness
and the first thickness are a same thickness.

15. A method comprising:
disposing a semiconductor device die on a substrate;
attaching a second portion of a lead directly to a device
contact pad on the semiconductor device die without an
intervening component between the lead and the device
contact pad, the lead being a dual gauge lead with the
second portion of the lead being disposed in a first
plane and having a first thickness smaller than a second
thickness of a first portion of the lead disposed in a
second plane different from the first plane, the lead
including a transition portion connecting the first por-
tion and the second portion, the transition portion
having a third thickness smaller than the second thick-
ness; and
encapsulating the semiconductor device die in a mold
body with the first portion of the lead extending outside
the mold body.

16. The method of claim 15, wherein disposing the
semiconductor device die on the substrate includes bonding
the semiconductor device die to a die attach pad (DAP) on
the substrate using a sintering process to bond the semicon-
ductor device die to the DAP.

17. The method of claim 15, wherein attaching the second
portion of the lead to the device contact pad on the semi-
conductor device die includes using a sintering process to
bond the second portion of the lead to the device contact pad.

18. The method of claim 15, wherein the lead is a first
lead, the device contact pad is a first device contact pad, and
disposing the semiconductor device die on the substrate
includes attaching a direct lead attach (DLA) clip to the
semiconductor device die, the DLA clip including a plurality
of leads with first portions of the plurality of leads including
the first portion of the first lead extending between a top and
a bottom of a collar and second portions of the plurality of
leads including the second portion of the first lead extending
above the top of the collar.

19. The method of claim 18, wherein attaching the second
portion of the lead to the device contact pad on the semi-
conductor device die includes: attaching the second portion
of the first lead of the plurality of leads to the first device
contact pad, attaching a second portion of a second lead of
the plurality of leads to a second device contact pad, and
attaching a second portion of a third lead of the plurality of
leads to a third device contact pad on the semiconductor
device die.

20. The method of claim 19, wherein attaching the second
portion of a second lead of the plurality of leads to the
second device contact pad and attaching the second portion
of the third lead of the plurality of leads to the third device
contact pad include using a sintering process.

21. The method of claim 20, wherein the first device
contact pad is a gate contact pad, the second device contact
pad is a sense contact pad, and the third device contact pad
is a source contact pad of the semiconductor device die.

22. The method of claim 18, wherein encapsulating the
semiconductor device die in the mold body with the second
portion of the lead extending outside the mold body includes
encapsulating the semiconductor device die in the mold
body with the collar of the DLA clip remaining outside the
mold body.

23. The method of claim 22 further comprising, removing
the collar from the DLA clip to individually separate the first
portions of leads attached to the collar.

24. The method of claim 23 further comprising, shaping the first portions of the plurality of leads to form external terminals of a device package.

* * * * *